(12) United States Patent
Choy et al.

(10) Patent No.: US 6,660,090 B2
(45) Date of Patent: Dec. 9, 2003

(54) FILM OR COATING DEPOSITION ON A SUBSTRATE

(75) Inventors: Kwang-Leong Choy, Birmingham (GB); Wei Bai, Guilderland, NY (US)

(73) Assignee: Innovative Materials Processing Technologies, Limited, London (GB)

( * ) Notice: Subject to any disclaimer, the term of this patent is extended or adjusted under 35 U.S.C. 154(b) by 0 days.

(21) Appl. No.: 09/912,859

(22) Filed: Jul. 25, 2001

(65) Prior Publication Data

US 2001/0054379 A1 Dec. 27, 2001

Related U.S. Application Data

(62) Division of application No. 09/449,069, filed on Nov. 24, 1999, now Pat. No. 6,296,910, which is a continuation of application No. PCT/GB98/01558, filed on May 28, 1998.

(30) Foreign Application Priority Data

May 29, 1997 (GB) ............................. 9711080

(51) Int. Cl.$^7$ .................... B05B 5/025; B05C 11/00
(52) U.S. Cl. ........................ 118/624; 118/666
(58) Field of Search .................. 118/620, 621, 118/624, 627, 666; 239/3, 690; 425/475, 457

(56) References Cited

U.S. PATENT DOCUMENTS

| | | | | |
|---|---|---|---|---|
| 4,794,619 A | * | 12/1988 | Tregay | 374/131 |
| 5,119,760 A | * | 6/1992 | McMillan et al. | 118/722 |
| 5,344,676 A | * | 9/1994 | Kim et al. | 118/621 |
| 5,935,337 A | * | 8/1999 | Takeuchi et al. | 118/724 |

* cited by examiner

Primary Examiner—Richard Crispino
Assistant Examiner—Y. T. Tadesse
(74) Attorney, Agent, or Firm—Frommer Lawrence & Haug; Thomas J. Kowalski; William S. Frommer

(57) ABSTRACT

A method of depositing a material onto a substrate, comprising the steps of: feeding a material solution to an outlet to provide a stream of droplets of the material solution; applying a potential difference between the outlet and a substrate to electrostatically attract the droplets from the outlet towards the substrate such that a corona discharge is formed around the outlet; heating the substrate to provide an increase in temperature between the outlet and the substrate; and progressively increasing the temperature of the substrate during material deposition.

8 Claims, 4 Drawing Sheets

FILM OR COATING DEPOSITION ON A SUBSTRATE

This Application is a Divisional of application Ser. No. 09/449,069, filed Nov. 24, 1999, which is a continuation of PCT/GB98/01558, filed on May 28, 1998, and claiming priority to UK Application No. 97110803, filed May 29, 1997.

This invention relates to the field of depositing films or coatings on a substrate.

Thermal barrier coatings (TBCs) are a type of film that is deposited on a substrate. A variety of techniques have been examined to fabricate TBCs, but to date only two processing routes have been successfully scaled up to produce thick TBCs, typically about 250 $\mu$m. These are the electron beam assisted physical vapour deposition (EB-PVD) and plasma spraying techniques which make extensive use of vacuum and sophisticated deposition equipment.

However, the above fabrication routes are expensive for large area units and mass production. Moreover, EB-PVD is a line-of-sight process which limits the capability of the method to coat three-dimensional components uniformly.

A new technique termed electrostatic spray assisted vapour deposition (ESAVD) is described in PCT/GB96/03105. ESAVD is a novel processing technique which offers a simple and cost effective method to manufacture ceramic films.

However, depositing the thick films that are generally required for TBCs has remained a problem.

This invention provides a method of depositing a material onto a substrate, comprising the steps of: feeding a material solution to an outlet to provide a stream of droplets of the material solution; applying a potential difference between the outlet and a substrate to electrostatically attract the droplets from the outlet towards the substrate; heating the substrate to provide an increase in temperature between the outlet and the substrate; and progressively increasing the temperature of the substrate during material deposition.

In the invention, it is recognised that when a thick film, especially an insulative film, such as that required for a TBC, is deposited, the insulating properties of the film tend to reduce the temperature of the material-receiving surface of the film with respect to that of the original substrate. So, while the substrate may be heated to a constant temperature, for example, by an electric back-heater on the rear face of the substrate so as to provide a temperature gradient from the substrate to the outlet, the actual surface of the deposited film, which receives the next layer of deposited material, can become progressively cooler.

To address this problem, the invention provides a progressively increasing substrate temperature so as to maintain a substantially constant temperature at the material-receiving surface.

This can lead to much more uniform properties through the deposition process, and so can lead to thick films, such as TBCs, being deposited with much more uniform, reliable and predictable thermal and mechanical properties.

As an example, the technique may be used for the fabrication of TBCs for gas turbine engines in power generation and aerospace applications. In addition, TBCs can also be used in automotive applications.

The present invention also provides an apparatus for depositing a material onto a substrate, comprising: an outlet; feeding means for feeding a material solution to the outlet to provide a stream of droplets of the material solution; a voltage source for applying a potential difference between the outlet and the substrate to electrostatically attract the droplets from the outlet towards the substrate; heating means for heating the substrate to provide an increase in temperature between the outlet and the substrate; a heating controller for controlling the heating means; and a temperature detector for detecting the temperature of a material-receiving surface on the substrate; wherein the heating controller is configured so as to be responsive to the temperature detector to control heating of the substrate to maintain a substantially constant temperature at the material-receiving surface.

Further respective aspects and features of the invention are defined in the appended claims.

An embodiment of the invention will now be described, by way of example only, with reference to the accompanying drawings, in which:

FIG. 1 schematically illustrates a film deposition apparatus in accordance with a preferred embodiment of the present invention;

Figure 1:
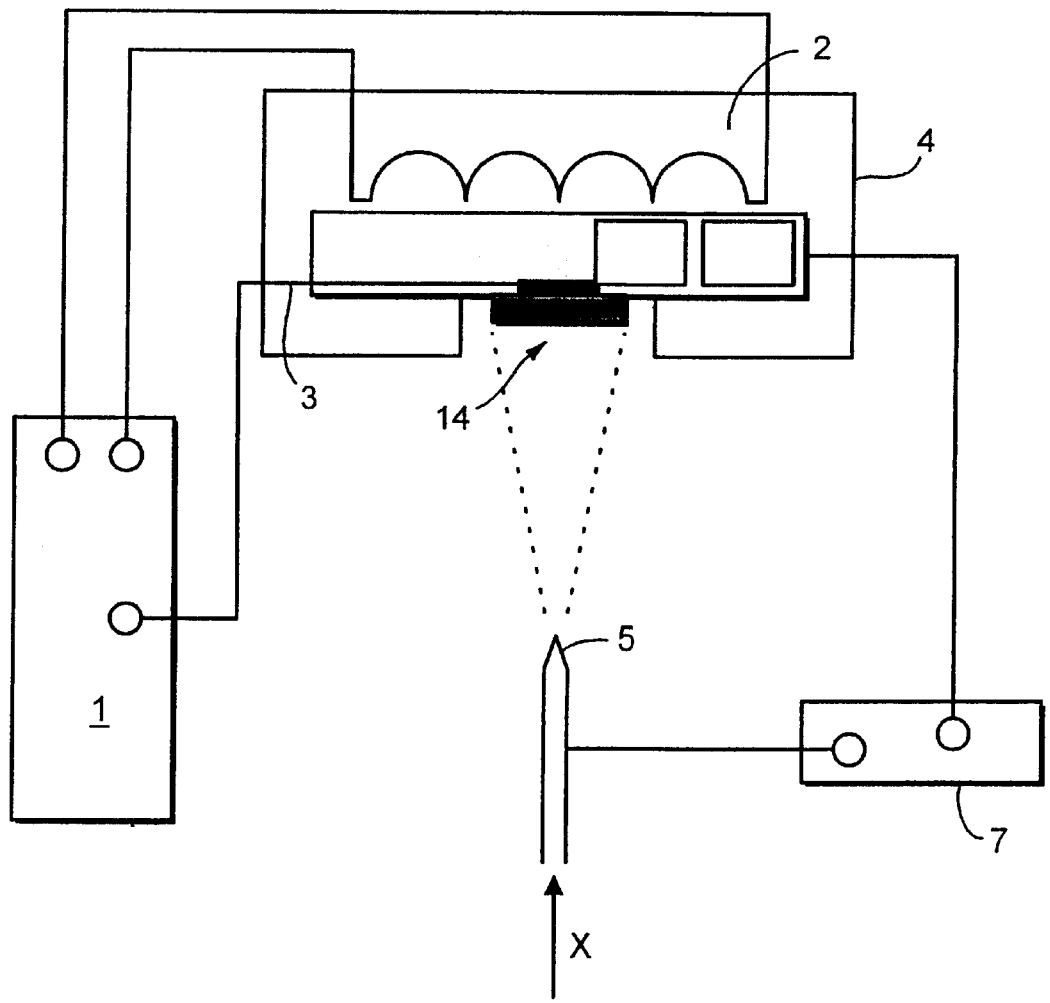
Figure 2A:
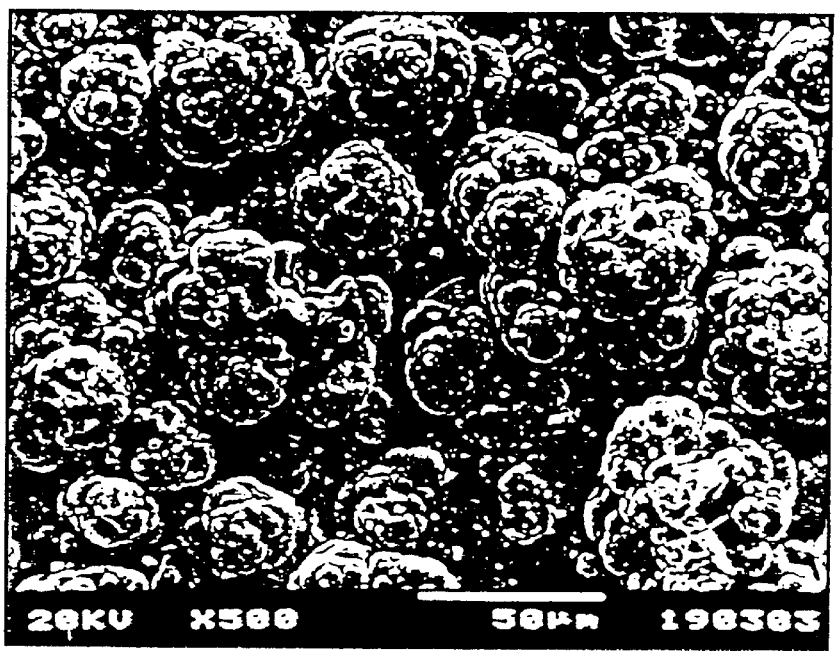
FIG. 2(a) shows the surface morphology of a TBC (YSZ) deposited at a temperature within the range of 600 to 650° C. for 1 hour.
Figure 2B:
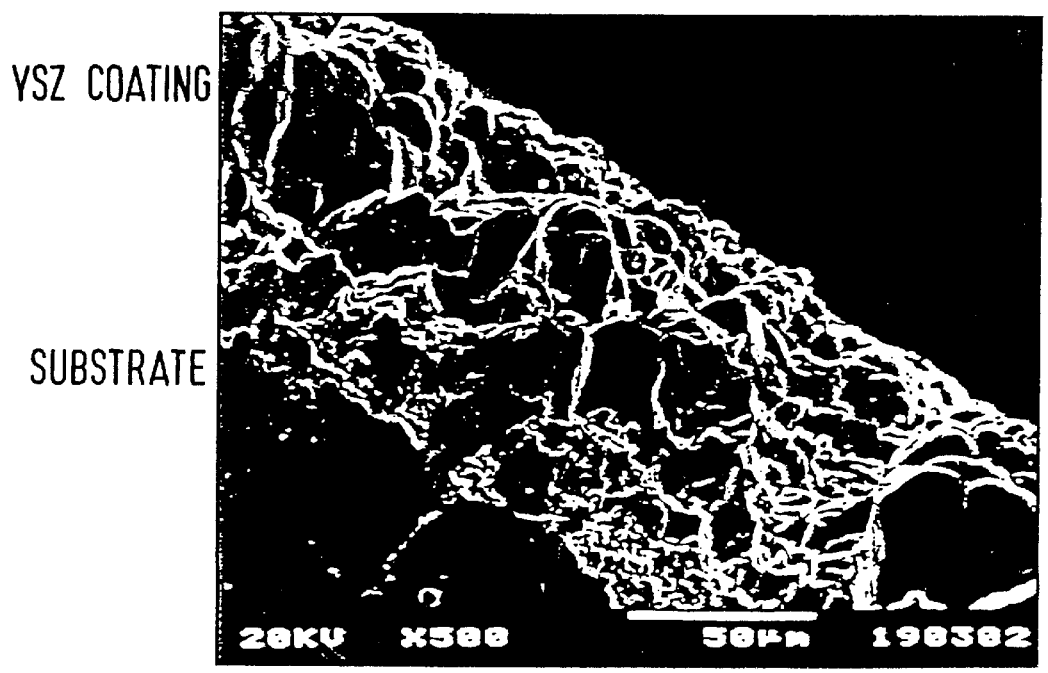
FIG. 2(b) shows a cross-sectional micrograph of the coating of FIG. 2(a)
Figure 4:
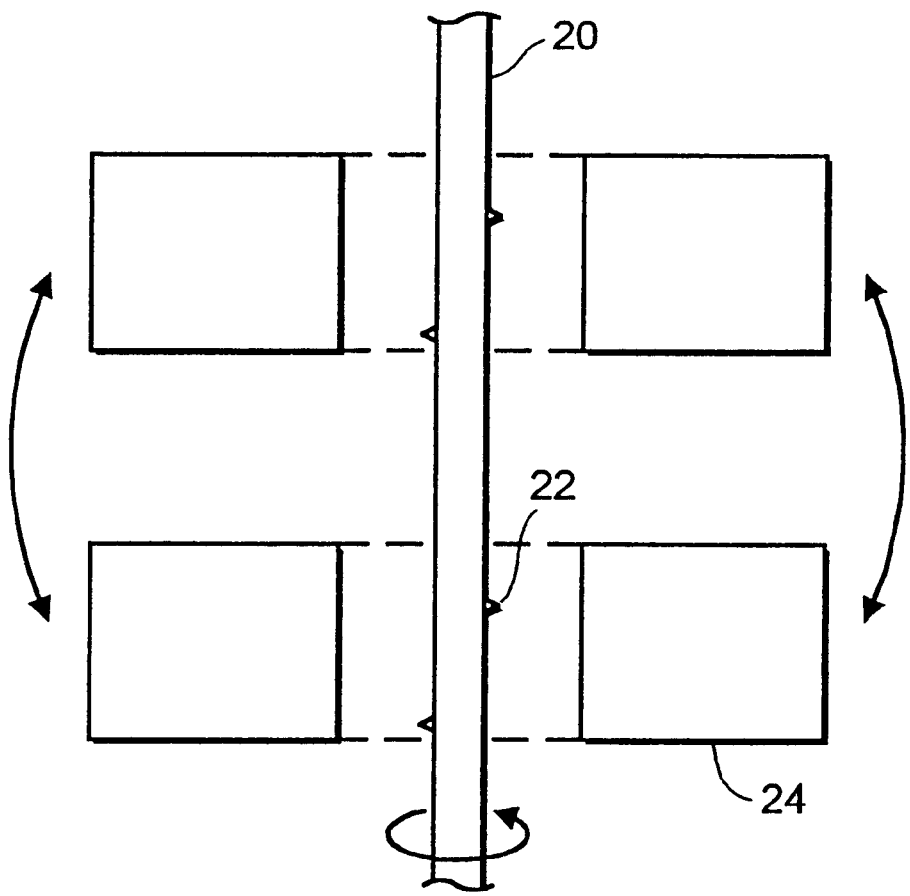

FIG. 4 schematically illustrates a modification of the film deposition apparatus of FIG. 1.

A film deposition apparatus as shown schematically in FIG. 1 comprises an outlet 5 for example a nozzle, spray head or similar, connected to a high voltage d.c. source 7, preferably variable in the range of from 0 to 30 kV. In operation with a corona field as described hereinbelow, a voltage of between about 4 and 15 kV (corresponding to a substrate temperature of approximately from 650 to 850° C.) would be normally used for the apparatus as shown, although for other applications a voltage of between about 5 and 30 kV might be appropriate.

A substrate holder 4 is earthed and is heated by a heater 2. The temperature of the shaped substrate holder 4 is controlled by a controller 1 and an attached thermocouple 3.

Heating the substrate holder 4 also causes a corresponding heating of the area surrounding the substrate 14 and between the substrate holder 4 and the outlet 5. This heating serves to set up a temperature gradient, whereby the ambient temperature increases as the substrate 14 is approached from the direction of the outlet 5. This increasing temperature facilitates a chemical vapour reaction of the coating solution that enables deposition of a ceramic film.

When an electric field of sufficient or appropriate strength is applied to the outlet a corona discharge is produced from the tip of the outlet 5. A liquid precursor for deposition of the ceramic coating is used to form the film and is fed into the outlet 5 in the direction indicated by an arrow X.

The inner diameter of the outlet 5 can vary from 1 to 0.1 mm. This relatively large inner diameter reduces the chances of clogging problems when high viscosity solutions are passed through the outlet 5.

A substantially constant flow in the range of from 0.4 to 60 ml per hour is maintained by use of a syringe pump or a constant static pressure feed. Alternatively, the flow rate can be varied, for example pulsed, if desired. This can lead to a layer structure being formed in the deposited film.

In this way, the electrostatic field set up between the charged outlet 5 and the earthed substrate holder 4 serves to guide charged coating solution droplets to the substrate 14. Droplets of the coating solution are provided with a positive charge by way of the high voltage d.c. source 7. These positively charged droplets are attracted to the earthed substrate holder 4. As an alternative, of course, the droplets could be negatively charged with respect to the earthed substrate holder 4.

The coating solution, which may be a mixture of $Zr(OC_4H_9)_4$, butanol and $Y(O_2C_8H_{15})_3$, is then passed to the outlet 5 and discharged towards the substrate 14. As an example, the sol precursor solution of the YSZ coating consists of zirconium (IV) butoxide $Zr(OC_4H_9)_4$, yttrium 2-ethylhexanoate $Y(O_2C_8H_{15})_3$ and a mixture of combustible solvents, for example from 70 to 80 vol % butanol and from 30 to 20 vol % acetylacetone. Ethanoic acid is used as a catalyst.

Preferably, the concentration of the desired coating solution is approximately 15 from 0.01 to 0.5 mol/l. In addition, the coating solution may have a viscosity in the region of about 0.01 to 50 mPas depending on the type of film that it is desired to produce.

The principles behind the technique, such as steering the droplets, the types of film, etc., are described in PCT/GB96/03105, which is incorporated herein by reference.

Table 1 below shows the compositions of coating solutions for various deposited films.

Accordingly, ESAVD involves spraying atomised precursor droplets across an electric field, whereby the charged droplets undergo combustion and/or chemical reaction in the vapour phase near the vicinity of the substrate 14, leading to the formation of a stable solid film with excellent adhesion to the substrate 14 in a single production process. The film tends to build up as an advantageous columnar structure.

This new method has the capability to provide molecular tailoring of microstructure and composition to produce stress-strain columnar structures with carefully engineered microporosity/microcracks, multilayer and graded features to improve the coating adhesion, erosion resistance, and lower the thermal conductivity of the TBCs. The stoichiometry of TBCs with different dopants can also be controlled precisely.

Higher deposition rates with this method are possible because the charged droplets are attracted towards an antipole substrate 14. In experiments, deposition rates were found to be between 1 and 5 $\mu$m per minute depending upon the processing conditions, for example the concentration, flow rate of YSZ coating solution and substrate temperature. The use of a corona discharge around the tip of the outlet 5 is preferred for the deposition of dense films with well controlled structure. During the deposition, the corona discharge can be observed in the tip of the outlet 5. This process can also be performed at reduced pressure to provide a glow discharge around the tip of the outlet 5.

The microstructure, grain size, surface morphology and thickness of YSZ TBCs are dependent on the process conditions.

Figure 3A:
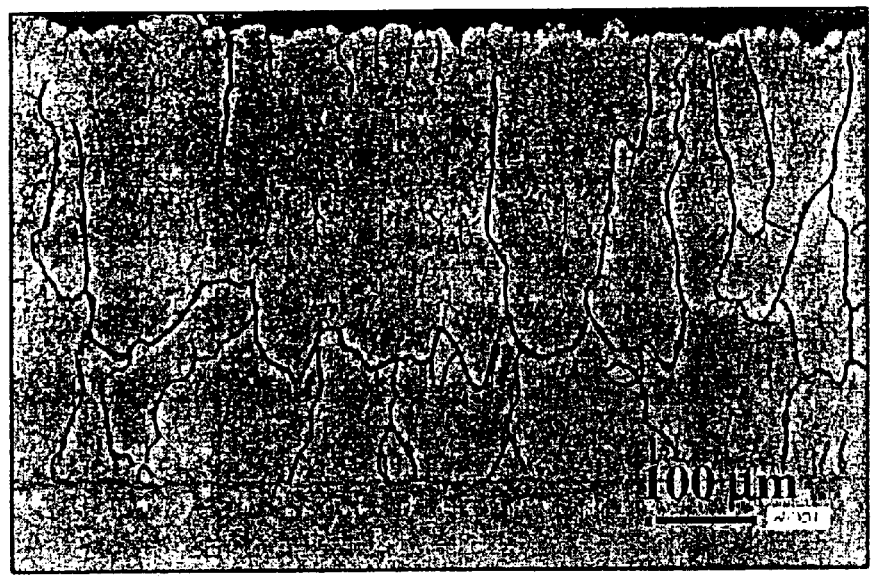
FIG. 3(a) shows the surface morphology of an approximately 400 $\mu$m thick TBC (YSZ) deposited at a temperature within the range of 600 to 650° C. for 1 hour.
Figure 3B:
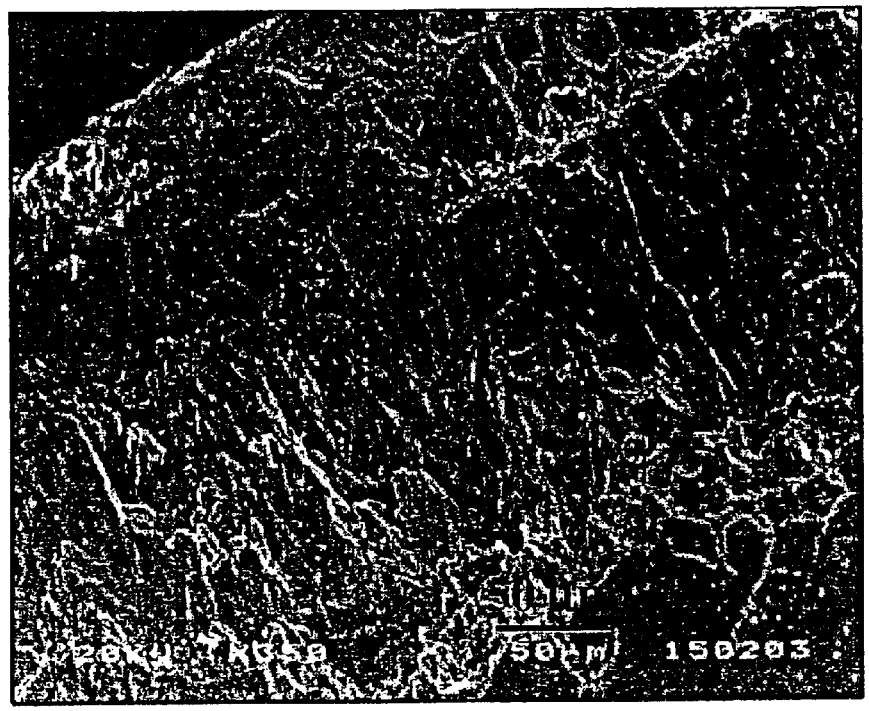
FIG. 3(b) shows a cross-sectional micrograph of the coating of FIG. 3(a)

The experimental results demonstrate both the technical and commercial viability of the ESAVD method in the cost-effective manufacture of TBCs with a columnar structure (see FIG. 3($b$)) and exhibiting a strain tolerance.

When a thick film, especially an insulative film, such as that required for a TBC, is deposited, the insulating properties of the film tend to reduce the temperature of the material-receiving surface of the film with respect to that of the original substrate. So, while the substrate may be heated to a constant temperature, the actual surface of the deposited film, which receives the next layer of deposited material, can become progressively cooler. This can affect the position, relative to the substrate surface, at which the chemical reaction of the precursor solution takes place, and so can affect the structure and properties of the deposited film.

To address this problem, and in order to maintain the chemical reaction at or near the vicinity of the material-receiving surface, the temperature of the substrate 14 is gradually increased, either continuously or in steps, as the coating thickness increases so as to maintain a near constant deposition, that is, material-receiving surface, temperature. In this embodiment the material-receiving surface temperature is measured using a thermocouple 3 or similar probe. In other embodiments the surface temperature can be continuously monitored using an infra red pyrometer or other optical detector. The resulting measurement is used to con-

TABLE 1

| Film | 1st Precursor | 2nd Precursor | Further Precursors | Solvent | Catalyst |
|---|---|---|---|---|---|
| PZT | $Pb(CH_3CO_2)_2$ & $Zr(OC_3H_7)_4$ | $Ti(OC_3H_7)_4$ | | $CH_3OCH_2CH_2OH$ | ethanoic acid |
| $PbTiO_3$ | $Pb(CH_3CO_2)_2$ | $Ti(OC_3H_7)_4$ | | $CH_3OCH_2CH_2OH$ | ethanoic acid |
| $BaTiO_3$ | $Ba(CH_3CO_2)_2$ | $Ti(OC_3H_7)_4$ | | $CH_3OCH_2CH_2OH$ | ethanoic acid |
| $SnO_2$—$In_2O_3$ | $In(NO_3)_3.xH_2O$ | $SnCl_2$ | | ethanol | ethanoic acid |
| La(Sr)$MnO_3$ | $La(NO_3)_3.xH_2O$ & $Mn(NO_3).6H_2O$ | $SrNO_3$ | | 20% $H_2O$ and about 80% ethanol | ethanoic acid |
| YSZ | $Y(O_2C_8H_{15})_3$ | $Zr(OC_4H_9)_4$ | | propanol or butanol | ethanoic acid |
| YSZ | $Y(O_2C_8H_{15})_3$ | $Zr(OC_4H_9)_4$ | | 70–80% butanol and 30–20% acetylacetone | ethanoic acid |
| YSZ | $Y(O_2C_8H_{15})_3$ | $Zr(OC_3H_7)_4$ | | propanol or butanol | ethanoic acid |
| NiO—YSZ | $Ni(NO_3)_2.6H_2O$ & $Zr(OC_3H_7)_4$ | $Y(O_2C_8H_{15})_3$ | | propanol or butanol | ethanoic acid |
| CGO (cerium gadolina) | $Ce(NO_3)_3.6H_2O$ | $Gd(NO_3)_3.6H_2O$ | | 20% $H_2O$ and 80% alcohol | HCl or $HNO_3$ |
| LSCF ($La_{1-x}Sr_xCo_{1-y}Fe_yO_3$) | $La(NO_3)_3.xH_2O$ | $Sr(NO_3)2$ | $Fe(NO_3)_3.9H_2O$ $Co(NO_3)_2.6H_2O$ | 20% $H_2O$ and 80% alcohol | HCl or $HNO_3$ | trol the substrate heater 2 via a feedback loop to maintain a constant temperature at the material-receiving surface.

The typical substrate temperature is within the range of from 600 to 850° C. A temperature range of from 400 to 850° C. is also possible. Films as thick as 3 mm have been produced using the method. The thickness of TBCs can be increased easily by reducing the discharge problem of the substrate 14 charging up to act against the applied field through changing the polarity, for example every twenty minutes, and gradually increasing the temperature of the substrate 14 during the deposition process. The polarity change during the deposition process also offers another benefit that TBCs with engineered columnar structures can be deposited on gas turbine hardware. The thickness and microstructure of the TBCs can be controlled by varying process parameters, for example the substrate temperature, electric field and deposition time, to provide improved thermal conductivity and mechanical properties. The amount of porosity and microcracking in the TBCs can also be controlled by varying the processing conditions.

TBCs of YSZ and $Al_3O_3$ have been successfully deposited onto Ni-based superalloy substrates. Such TBCs can also be deposited onto metallic, ceramic or polymer substrates. TBCs with multilayer structures or graded composition structures can also be achieved by varying the processing conditions, for example the electric field, deposition temperature, material solution flow rate, and material solution composition and/or concentration during the coating process. There is no restriction as to the means of heating the substrate 14. The heating method can be infra red, laser, flame or microwave, etc. The substrate 14 can also be heated locally to enhance deposition in those local areas. The ESAVD process can be scaled-up and adapted for the coating of three-dimensional components, such as gas turbine blades, by using computer controlled multiple nozzles and/or by rotating the components. The multiple nozzles can be stationary and/or movable. Further, the ESAVD process can be performed in an open atmosphere or at a reduced pressure.

These techniques are not only applicable for the manufacture of TBCs, but also for other thick coatings and the fabrication of solid oxide fuel cell components, as well as a variety of other structural and functional applications.

FIG. 4 schematically illustrates a modification of the above-described deposition apparatus which is particularly suitable for irregularly shaped parts such as gas turbine engine components.

A hollow rotating shaft 20 carries a plurality of spaced nozzles (outlets) 22, through which a precursor solution is sprayed. The shaft 20 rotates about its own axis. The units 24 onto which material is to be deposited are arranged on one or more common supports around the shaft 20. Using these supports, the units 24 can be rocked up and down as shown. The combination of the rocking motion and the rotation of the spaced nozzles 22 can provide a relatively even deposition coverage.

The material solution can be varied during the deposition process, for example to build up a layer structure of different materials or to provide a graded layer having a smoothly varying composition. For example, on an Ni-based superalloy substrate, a bond coating layer of MCrAlY (M may be Ni) is first deposited. A layer of $Al_2O_3$ is then deposited or allowed to form. A graded TBC is then deposited, starting with substantially 100% $Al_2O_3$ but varying its composition as the coating builds up so that the proportion of $Al_2O_3$ is gradually decreased and the proportion of YSZ gradually increases. This is performed by simply changing the precursor composition and/or the deposition temperature as it is being delivered.

In other embodiments, to decrease the thermal conductivity, which is advantageous for TBCs, a multilayer approach can be used. The layers could be of different material compositions or alternatively different structures of the same composition. For example, alternate layers of YSZ can be formed by (a) a heterogeneous reaction which occurs near to the substrate surface and provides a dense layer, and (b) a mixture of heterogeneous and homogeneous reactions (a homogeneous reaction occurs in the gas phase well away from the substrate surface) which provide a porous layer. The two types of layers have different mechanical and thermal (insulative) properties. Alternating between the two types of deposition is as simple as changing the substrate temperature, for example by 10 or 15° C. Other variations can be obtained by varying the material solution concentration.

What is claimed is:

1. An apparatus for depositing a material onto a substrate, comprising:
   an outlet;
   a material solution feeder for feeding a material solution to the outlet to provide a stream of droplets of the material solution;
   a voltage source for applying a potential difference between the outlet and the substrate to electrostatically attract the droplets from the outlet towards the substrate;
   a heater for heating the substrate to provide an increase in temperature between the outlet and the substrate;
   a heating controller for controlling the heater; and
   a temperature detector for detecting the temperature of a material-receiving surface on the substrate;
   wherein the heating controller is configured so as to be responsive to the temperature detector to progressively increase the temperature of the substrate during material deposition so as to maintain a substantially constant temperature at the material-receiving surface.

2. An apparatus according to claim 1, wherein the temperature detector is an optical temperature detector.

3. An apparatus according to claim 1, wherein the material is deposited as a thermal barrier coating.

4. An apparatus according to claim 1, wherein the material is deposited with a thickness suitable for a thermal barrier coating.

5. An apparatus according to claim 1, wherein the material is deposited as a film.

6. An apparatus according to claim 5, wherein the film is one of a multicomponent oxide film, a simple oxide film or a doped film.

7. An apparatus according to claim 5, wherein the film is one or more of a structural film, a functional film and an electroceramic film.

8. An apparatus according to claim 1, wherein the material is deposited as a powder.

* * * * *